United States Patent
Kundu et al.

(10) Patent No.: US 12,278,643 B2
(45) Date of Patent: Apr. 15, 2025

(54) CALIBRATION FOR DTC FRACTIONAL FREQUENCY SYNTHESIS

(71) Applicant: Intel Corporation, Santa Clara, CA (US)

(72) Inventors: Somnath Kundu, Hillsboro, OR (US); Stefano Pellerano, Beaverton, OR (US); Brent R. Carlton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 694 days.

(21) Appl. No.: 17/481,827

(22) Filed: Sep. 22, 2021

(65) Prior Publication Data

US 2023/0098856 A1 Mar. 30, 2023

(51) Int. Cl.
*H03L 7/197* (2006.01)
*H03L 7/091* (2006.01)
*H03L 7/099* (2006.01)

(52) U.S. Cl.
CPC ............ *H03L 7/1976* (2013.01); *H03L 7/091* (2013.01); *H03L 7/0995* (2013.01)

(58) Field of Classification Search
CPC ...... H03L 7/1976; H03L 7/091; H03L 7/0995
See application file for complete search history.

(56) References Cited

U.S. PATENT DOCUMENTS

| | | | | |
|---|---|---|---|---|
| 9,490,818 B2 * | 11/2016 | Perrott | .................. | H03M 3/368 |
| 10,419,007 B2 * | 9/2019 | Gao | ....................... | H03L 7/0992 |
| 10,425,086 B1 * | 9/2019 | Chen | ....................... | H03B 5/04 |
| 10,784,872 B1 * | 9/2020 | Tsai | ....................... | H03L 7/087 |
| 10,826,507 B1 * | 11/2020 | Gong | ....................... | H03L 7/183 |
| 10,895,850 B1 * | 1/2021 | Elkholy | ................ | G04F 10/005 |
| 11,418,205 B1 * | 8/2022 | Schwarz | ............... | H03L 7/0992 |
| 11,632,116 B2 * | 4/2023 | Perrott | .................... | H03L 7/087 327/156 |
| 11,777,510 B2 * | 10/2023 | Lim | ...................... | H03L 7/1976 327/156 |
| 12,147,201 B2 * | 11/2024 | Bhat | ..................... | H03L 7/0992 |
| 2012/0112809 A1 * | 5/2012 | Zhu | ....................... | H03L 7/1976 327/159 |
| 2013/0033293 A1 * | 2/2013 | Zhang | .................. | H03L 7/1976 327/156 |
| 2017/0366376 A1 * | 12/2017 | Wang | .................. | H04L 27/2017 |

(Continued)

*Primary Examiner* — Adam D Houston
(74) *Attorney, Agent, or Firm* — Schwegman Lundberg & Woessner, P.A.

(57) ABSTRACT

A digital-to-time converter (DTC)-based open loop frequency synthesis and calibration circuit may be used to provide a precise clock signal. The DTC calibration circuit may include a DTC to generate a DTC clock signal based on a received input clock frequency and a received initial digital input code, a phase-lock loop (PLL) to generate a PLL clock signal based on a received PLL input, a binary phase-detector (PD) to generate a PD output based on a comparison between the DTC clock signal and the PLL clock signal, a plurality of calibration bins to generate a signed accumulated PD portion based on the PD output, and an adder to generate a calibrated DTC input code based on a combination of the signed accumulated PD portion and a subsequent digital input code, where the DTC generates a calibrated clock signal based on the calibrated DTC input code.

25 Claims, 10 Drawing Sheets

(56) References Cited

U.S. PATENT DOCUMENTS

| | | | |
|---|---|---|---|
| 2019/0310587 A1* | 10/2019 | Kim | H03L 7/0802 |
| 2022/0393690 A1* | 12/2022 | Banin | H03L 7/081 |
| 2023/0179215 A1* | 6/2023 | Janardhanan | H03M 1/1014 |
| | | | 341/120 |
| 2024/0137029 A1* | 4/2024 | Luo | H03L 7/091 |
| 2024/0291495 A1* | 8/2024 | Lu | H03L 7/085 |

* cited by examiner

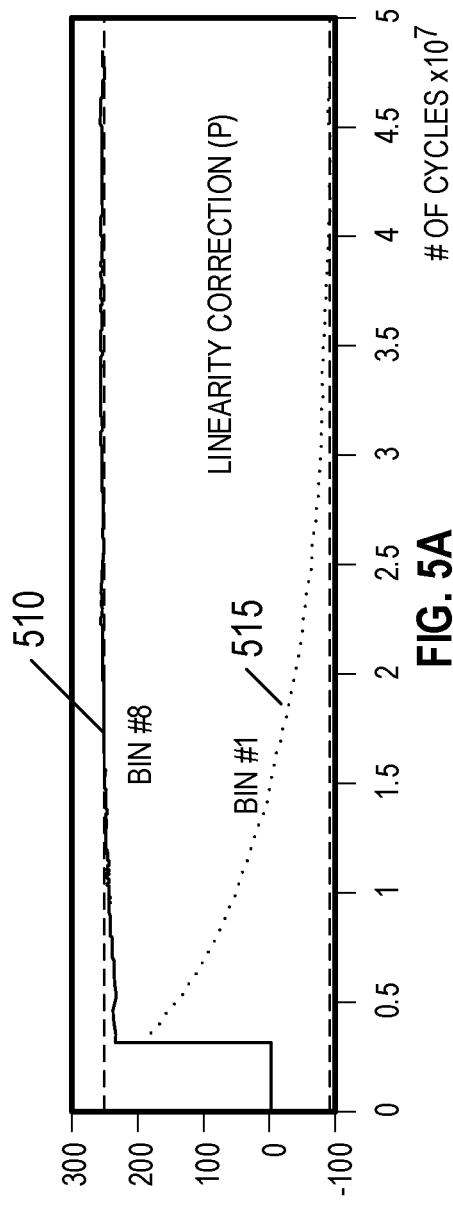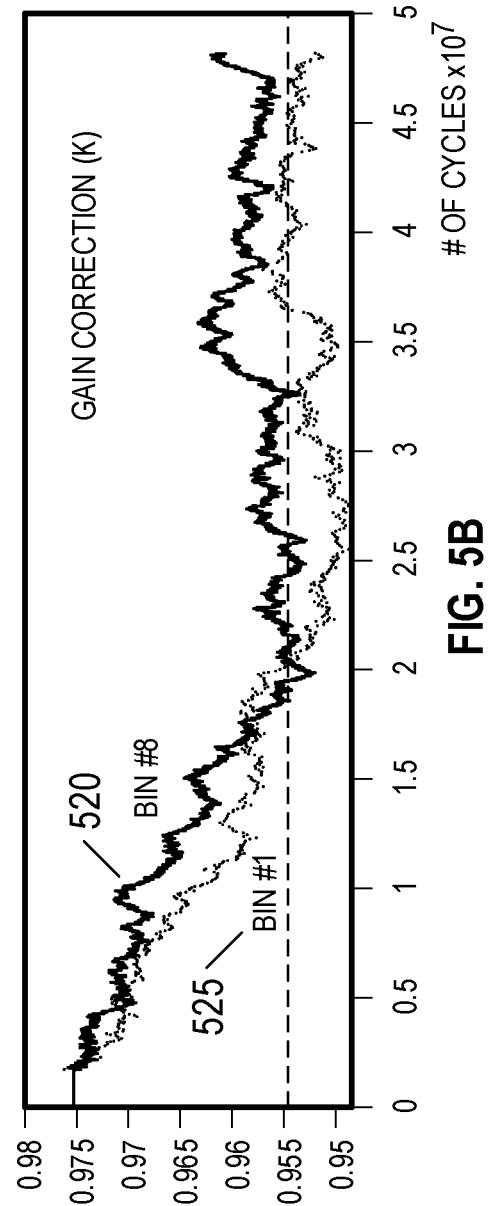
FIG. 5A
FIG. 5B

CALIBRATION FOR DTC FRACTIONAL FREQUENCY SYNTHESIS

TECHNICAL FIELD

Embodiments described herein pertain to integrated circuit (IC) devices and systems. Some embodiments relate to calibration of precise clock sources on IC devices and systems.

BACKGROUND

Frequency synthesizers are used in many system-on-a-chip (SoC) devices and other integrated circuits (ICs) devices to generate precise clock sources. Frequency synthesizers may include phased-locked loops (PLLs), which may be implemented with an LC resonator oscillator to meet stringent requirements on frequency accuracy and jitter. However, PLL LC oscillators often occupy a large silicon area due to the size of the LC resonator inductor coil. SoC devices often include multiple modules on each device, such as multicore processors, memories, I/O interfaces, power management, and wireless transceivers. Because many SoC devices require a separate clock sources for each of the multiple modules on the device, duplicating the PLL multiple times creates a significant portion of the available silicon area. In addition, electromagnetic (EM) coupling among multiple coils in the LC oscillator may degrade spectral purity and jitter.

BRIEF DESCRIPTION OF THE DRAWINGS

FIGS. 5A-5B show transient convergence calibration graphs, according to some embodiments described herein.

DETAILED DESCRIPTION

Figure 1:
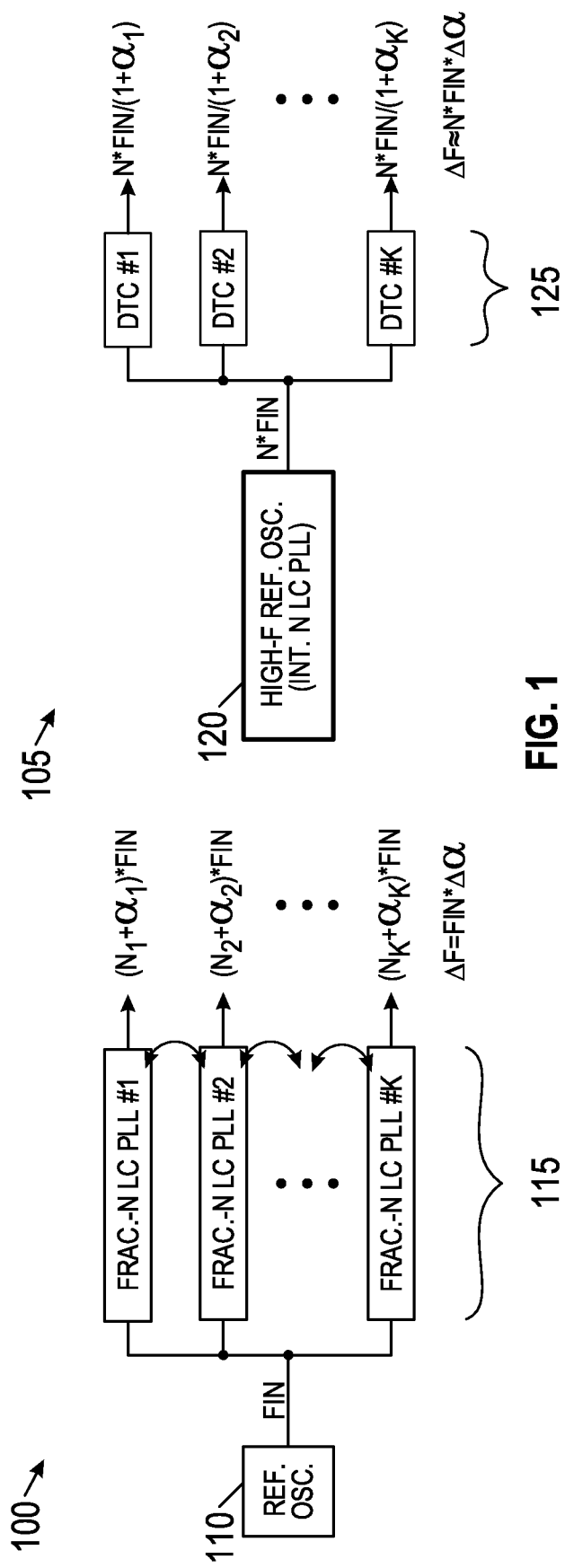
FIG. 1 shows a comparison between a first frequency synthesis apparatus and a second frequency synthesis apparatus, according to some embodiments described herein.

A digital-to-time converter (DTC)-based open loop frequency synthesis and calibration circuit may be used to provide a precise clock signal. The DTC device may use a high frequency reference clock to drive multiple DTCs, where each DTC may be used to generate different fractional frequencies. The high frequency reference clock used to drive each DTC may be generated by a single integer-N LC PLL or generated directly from high frequency resonators (e.g., microelectromechanical system (MEMS) resonator, thin-film bulk acoustic resonator (FBAR)). Because the DTCs may be implemented using gate delays, they provide a technical solution that is compact, easy to scale, easy to port across technology nodes, does not suffer from signal degradation due to EM coupling, and provides a wide tuning range to cover a wide clock frequency range. The improved precision of the clock signal generated by this DTC device may be used to improve performance of processing devices (e.g., central processing units (CPUs), graphics processing units (GPUs), input/output (I/O) devices, or other IC devices that receive a clock input. This DTC device may also be used as a phase/frequency modulator in a digital polar transmitter to provide improved silicon area use and improved power efficiency.

To improve the precise clock signal provided by the DTC-based fractional frequency synthesis, the technical solutions described herein include calibrating the gain and linearity. This calibration reduces or eliminates degraded performance due to signal spurs or jitter across process, voltage, and temperature (PVT) variations during fabrication. This DTC gain and non-linearity calibration circuit uses a binary phase detector (PD) and a ring PLL as an auxiliary reference. The ring PLL generates a noisy but relatively spur-free clock that is compared against the clock generated by the DTC using the binary PD. A ring PLL may be preferred for this DTC calibration circuit, which may provide a compact solution where multiple such DTCs are present within a single DTC calibration circuit, such as second frequency synthesis apparatus 105 shown in FIG. 1. However, a DTC calibration circuit may also be implemented using a low-power PLL (e.g., LC PLL) that would require a much lower power source to meet a given jitter spec, such as when silicon area or EM coupling is not a concern. The PD output is then used to correct for any delay offset and non-linearity of the DTC. An error signal may be generated after averaging phase comparisons over many cycles to minimize or eliminate the effect of noise in the PLL. The DTC calibration circuit may also include a least means squared (LMS) correlator loop to correct for DTC gain variation.

The DTC calibration circuit may be used to provide improved jitter performance and figure-of-merit. Because the noise contribution of a delay cell is much smaller compared to a ring oscillator of the same period, excellent jitter performance may be achieved from this DTC based frequency synthesis. Power estimated from DTC calibration circuit simulations in 22FFL process shows 5 mW and 6.5 mW power dissipation for a DTC based and an LC-PLL based techniques respectively, to synthesize a 1 GHz clock to meet the RMS jitter budget of 100 fs. DTC shows better performance at higher frequencies due to the implementation of smaller delays.

The DTC calibration circuits described herein provides advantages over other solutions. Solutions that use a digitally controlled delay line (DCDL) to implement a DTC require a small DTC range and relaxed jitter specification and require additional foreground calibration to compensate for any static offset error. In contrast, DTC calibration circuits described herein work with a wide DTC range and jitter specification, and do not require additional static offset foreground calibration. Solutions that use a phase interpolator and a multi-phase divided clock to implement coarse and fine DTC and require higher order comb filters at the spur frequencies to cancel the spurs. In contrast, DTC calibration circuits described herein do not require the phase interpolator, multi-phase divided clock, or higher order comb filters. Further, because the DTC calibration circuits described herein do not require dividing the input clock, these DTC calibration circuits avoid the significant power requirements from frequency generation, multiplication, and division, and avoid distributing either high frequency PLL outputs or multi-phase divided outputs across multiple DTC modules to perform frequency synthesis independently. Additionally, the DTC calibration circuits described herein avoid excessive power consumption and foreground calibration requirements, such as used in solutions that include a digital polar transmitter where a time-to-digital (TDC) is used to detect the DTC nonlinearity. These DTC calibration circuits provide a low-power open-loop frequency synthesis architecture without requiring frequency translation by leveraging a calibration technique that may correct the DTC gain and linearity error over a wide DTC delay range. Additional improvements and benefits are described below with reference to FIG. 1 through FIG. 10.

FIG. 1 shows a comparison between a first frequency synthesis apparatus 100 and a second frequency synthesis apparatus 105, according to some embodiments described herein. First frequency synthesis apparatus 100 provides a closed-loop solution that includes a uses a reference oscillator 110 and multiple separate LC PLLs 115. The separate PLLs 115 are used in each module to perform frequency synthesis independently, where each PLL synthesizes frequency by adjusting the integer (Nk) as well as fractional part ($\alpha$k) of the frequency multiplication factor. The first frequency synthesis apparatus 100 may provide frequency synthesis with reduced jitter, however this use of multiple separate LC PLLs 115 in a single SoC may require significant silicon area, as LC PLLs are relatively bulky IC components and introduce EM coupling and pulling.

In contrast with the use of multiple separate LC PLLs 115 in first frequency synthesis apparatus 100, the second frequency synthesis apparatus 105 provides an open-loop solution that includes a uses a single input high-frequency reference oscillator 120 (e.g., integer-N LC PLL) and multiple DTCs 125. By using a single reference oscillator 120 and multiple DTCs 125, the second frequency synthesis apparatus 105 may be used to provide frequency synthesis over a wide frequency range with low jitter and reduced silicon area requirements. The second frequency synthesis apparatus 105 also provides improved performance at higher frequencies due to the requirement of lower delay range.

Figure 2:
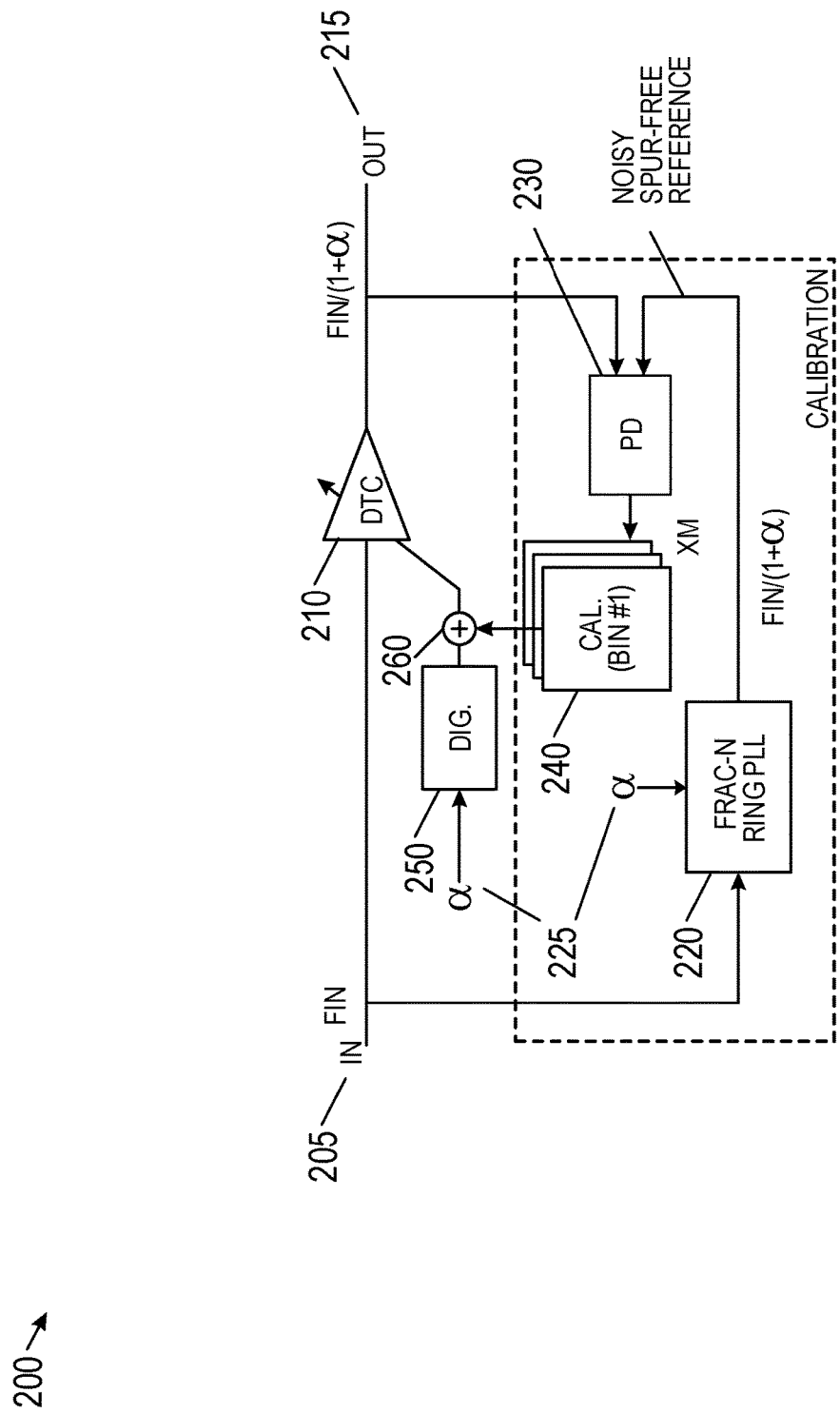
FIG. 2 shows DTC calibration circuit, according to some embodiments described herein.

FIG. 2 shows DTC calibration circuit 200, according to some embodiments described herein. Circuit 200 includes a DTC 210, which takes an input clock signal 205 and provides an output clock signal 215 at a desired frequency. Circuit 200 includes low-power fractional-N ring oscillator PLL 220 to generate a clock signal at the same frequency of the desired output frequency of the DTC. PLL 220 receives an input fractionality $\alpha$ 225 that is highly dithered to minimize spurs, but at the cost of higher phase-noise. A binary PD (e.g., 1-bit PD) 230 compares the noisy edges of the output of the PLL 220 against the output of the DTC 210 to correct for any DTC deterministic error or spurs. Although the PLL edges are noisy, the PLL jitter has an associated zero mean value, so performing the phase comparison over many cycles reduces or eliminates the effect of PLL noise while measuring the error in DTC delay accurately. The output of the binary PD 230 is provided to a calibration bin 240, which performs linearity and gain calibration over each bin, such as shown in FIGS. 3A-3D. A digital input code 250 also takes input fractionality $\alpha$ 225 and generates a digital input code to be used by DTC 210. An adder 260 is used to combine the digital input code with the calibration output provided by each calibration bin 240 to generate a calibrated DTC input code. This calibrated DTC input code is provided to the DTC 210, which generates a calibrated clock signal output based on the calibrated DTC input code.

Figure 3A:
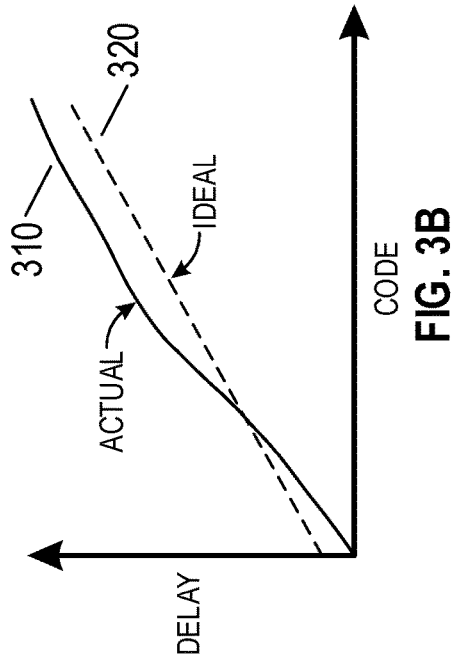
FIGS. 3A-3D shows linearity and gain calibration graphs, according to some embodiments described herein.
Figure 3B:
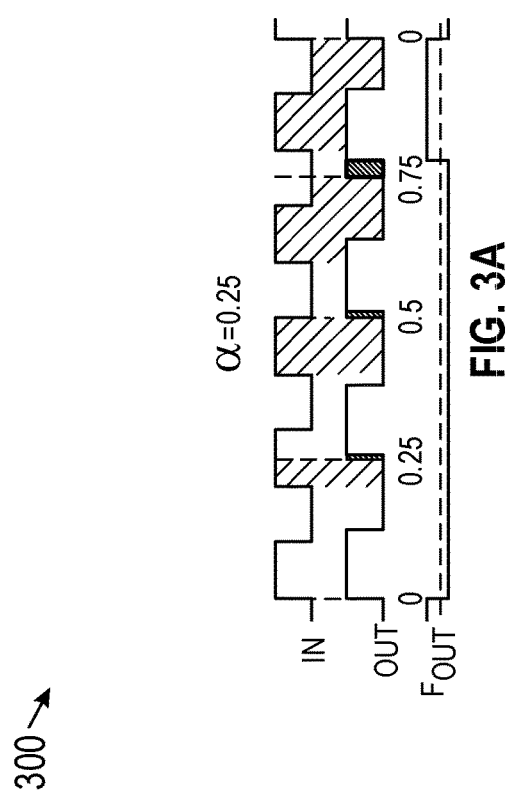

FIGS. 3A-3D shows linearity and gain calibration graphs 300, according to some embodiments described herein. DTC calibration circuit 200 provides improved DTC delay calibration accuracy, which reduces or eliminates gate delay due to PVT variations and provides improved open-loop frequency synthesis. Delay errors for four bins (e.g., fractionality $\alpha$=0.25) may be seen in timing diagram shown in FIG. 3A and in delay diagram shown in FIG. 3B. As shown in FIG. 3B, the actual delay 310 may differ from the ideal delay 320. Any delay error changes the instantaneous clock frequency, which may result in significant spurs. The DTC delay may suffer from gain mismatch due to the absolute delay variation in each stage, and may suffer from nonlinearity due to the path delay mismatch when the code changes.

Figure 3C:
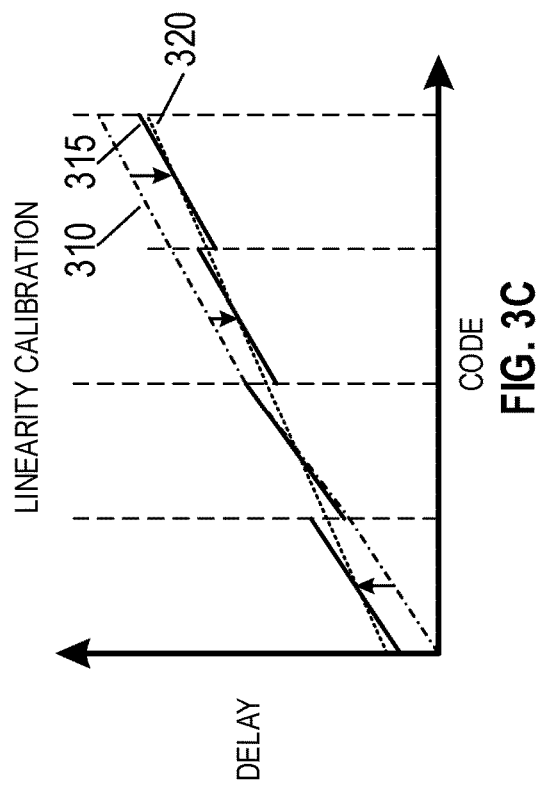

FIG. 3C shows a linearity calibration. The delay is separated into four bins, and the linearity calibration is performed in each bin by adjusting the bin average phase error to zero. As shown in the linearity calibration graph in FIG. 3C, the mean of the actual delay for each bin 310 is adjusted to match the mean of the ideal delay 320, which may result in reduced delay 315. This linearity mean adjustment is performed by continuously accumulating the PD output. The signed accumulator output is then added to the DTC code to correct any delay error.

Figure 3D:
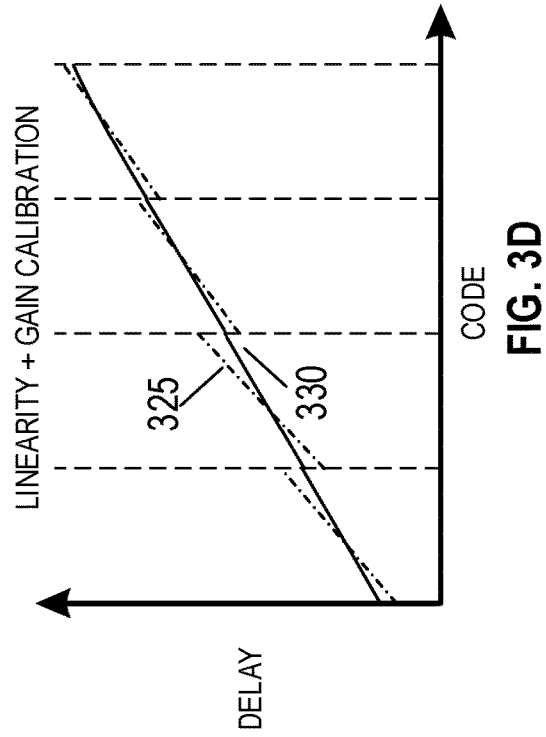

FIG. 3D shows a gain calibration applied following the linearity calibration shown in FIG. 3C. With the presence of any linearity error, the accumulator outputs in each calibration bin will settle to different values. Within each calibration bin, the gain calibration is performed by correlating the DTC code with the PD output using an LMS correlator 445. With the presence of any gain error, the PD output will generate a pattern (e.g., 111 . . . 000 . . . , 000 . . . 111 . . . ). By correlating this pattern with the DTC code, each calibration bin detects whether the gain is higher or lower than the desired value, and the gain is corrected by introducing a multiplication factor k 450 in the DTC code. An example of this is shown in the second bin within FIG. 3D, in which the gain (e.g., line slope) of the linearly calibrated delay line segment 325 is corrected by multiplication factor k 450 to result in a linearly gain-calibrated line segment 330.

Figure 4:
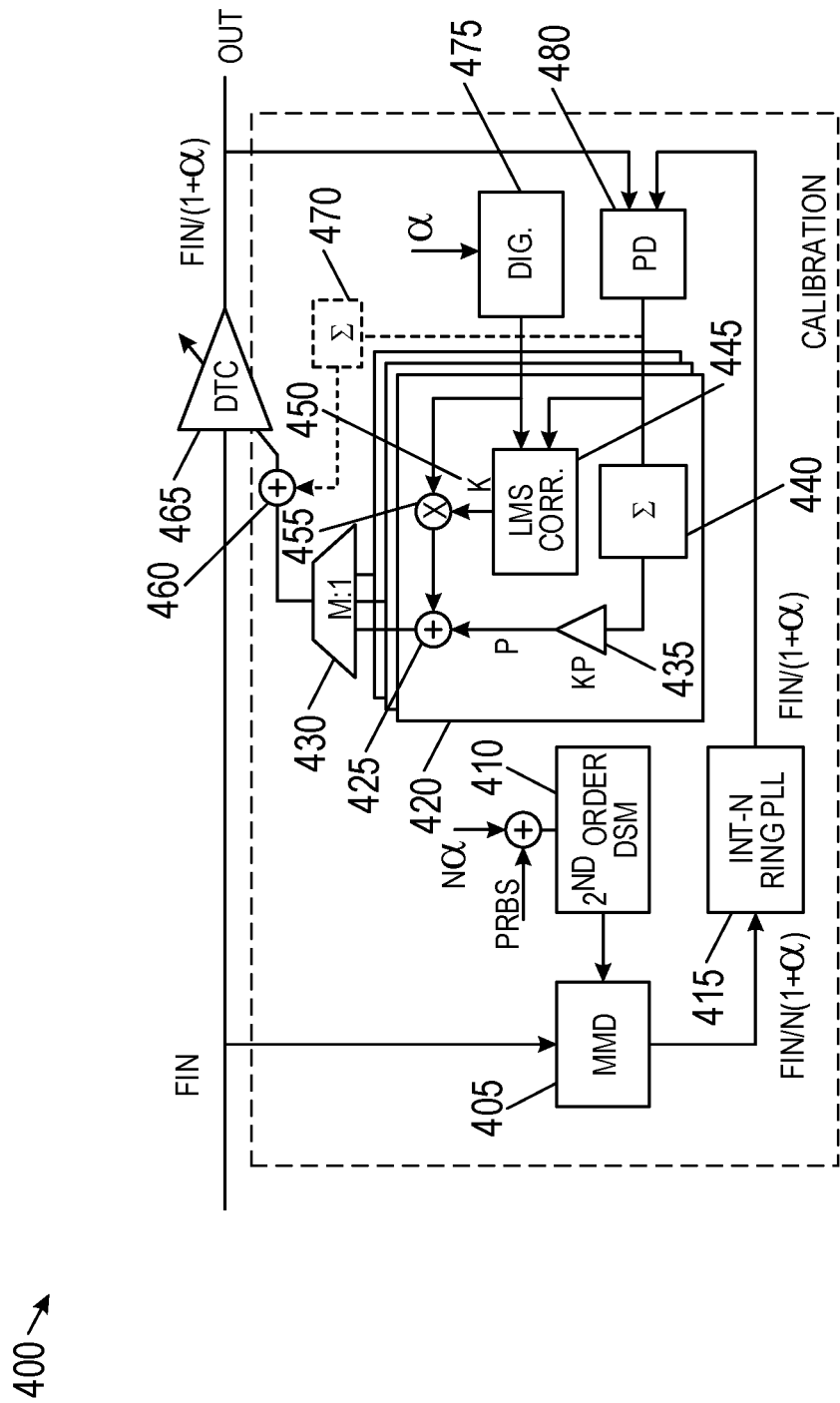
FIG. 4 shows a DTC calibration circuit architecture, according to some embodiments described herein.

FIG. 4 shows a DTC calibration circuit architecture 400, according to some embodiments described herein. A multi-modulo divider (MMD) 405 is used to generate noisy but spur-free reference clock signal. A second order delta-sigma modulator (DSM) 410 fed with a pseudo-random bit sequence (PRBS) is used to dither the output of the MMD 405, which reduces or eliminates periodic pattern causing spurs. For an input clock frequency of fin and dithered input from the MMD 405, the MMD 405 generates an MMD output frequency of fin/(1+$\alpha$). This MMD output signal is fed into an integer-N ring PLL 415. Because the calibration loop reduces or eliminates noise from any the output of PLL 415, a bulky and high-power PLL 415 is not needed to filter its output, so PLL 415 may be selected to be a compact and low-power PLL.

The output of PLL is provided to binary PD 480. The binary PD 480 compares the noisy edges of the output of the PLL 415 against the output of the DTC 465 to correct for DTC deterministic error or spurs. Although the PLL edges are noisy, the PLL jitter has an associated zero mean value, so performing the phase comparison over many cycles reduces or eliminates the effect of PLL noise while accurately measuring the DTC delay error.

The output of the binary PD 480 is provided to each of M calibration bins 420. Each bin uses a digital accumulator 440 followed by a gain stage 435 to form the linearity calibration loop. The gain error within each bin may be corrected by an LMS correlator 445. The LMS correlator 445 correlates the output of the PD 480 with an output from the DTC code generator 475 extract a gain error and determine multiplication factor k 450. The multiplication factor k is then provided to a multiplier 455, which applies the multiplication factor k to the output from the DTC code generator 475 to generate a gain-corrected digital input code. An adder 425 is used to combine the gain-corrected digital input code with the calibration output provided by the digital accumulator 440 and gain stage 435 and provide a calibrated DTC input code for each of the M bins. A multiplexer 430 selects the desired bin from among the M calibration bins 420 and provides a calibrated DTC input code to the DTC 465. Any static phase error between the DTC and PLL edges may be corrected by an accumulator 470 and combined with the calibrated DTC input code. The DTC 465 then generates a calibrated clock signal output based on the calibrated DTC input code. For an input clock frequency of fin and fractional code a, the DTC 465 generates an output frequency of fin/(1+a).

FIGS. 5A-5B show transient convergence calibration graphs 500, according to some embodiments described herein. FIG. 5A shows a linearity gain transient convergence, and FIG. 5B shows a gain transient convergence. FIGS. 5A-5B display convergences based on discrete-time model that simulates the spur of each block, the power dissipation of each block, device thermal noise, and flicker noise. The simulation included a specified jitter of 50 fs to synthesize a 1 GHz input clock, with a DTC and a ring PLL in a 22 nm low-power FinFET (22FFL) process that dissipate 3 mW and 1 mW, respectively. The associated digital switching power is estimated to be about 2 mW, which may be reduced further by using a divided clock for calibration or by duty-cycling the operation. The simulated DTC includes 3-bit coarse and 10-bit fine control. FIGS. 5A-5B show the convergence of the linearity and gain correction loop for $\alpha=1/210$ using 8-bins. As shown in FIG. 5A, the linearity correction may converge quickly for bin #8 510 but converge slowly for bin #1 515. As shown in FIG. 5B, the gain correction may exhibit similar convergence times for bin #8 520 and for bin #1 525. The convergence time is strongly dependent on the PLL output noise and the calibration loop bandwidth. The convergence time of the DTC calibration circuit may be reduced by storing a calibration code into memory and applying this stored calibration code as an initial calibration code value for a subsequent DTC calibration.

Figure 6A:
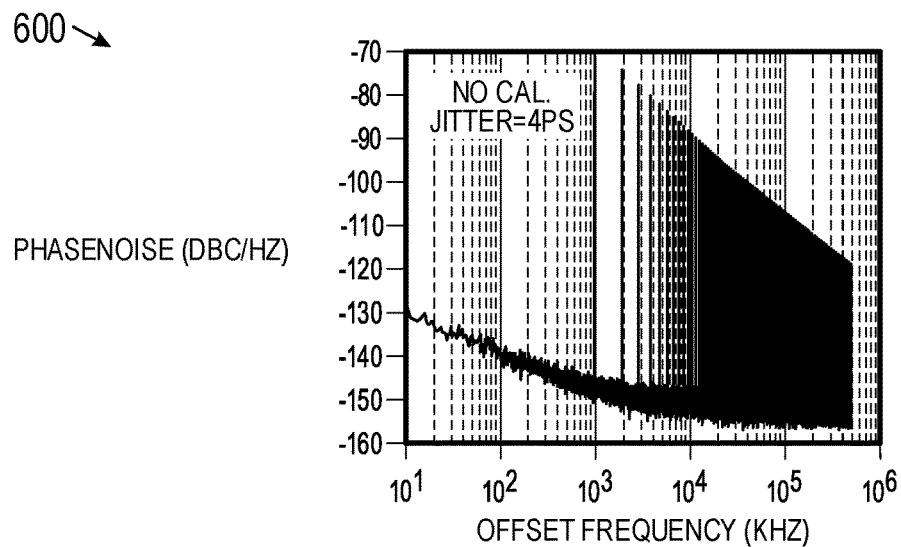
FIGS. 6A-6C show simulated phase-noise graphs, according to some embodiments described herein.
Figure 6B:
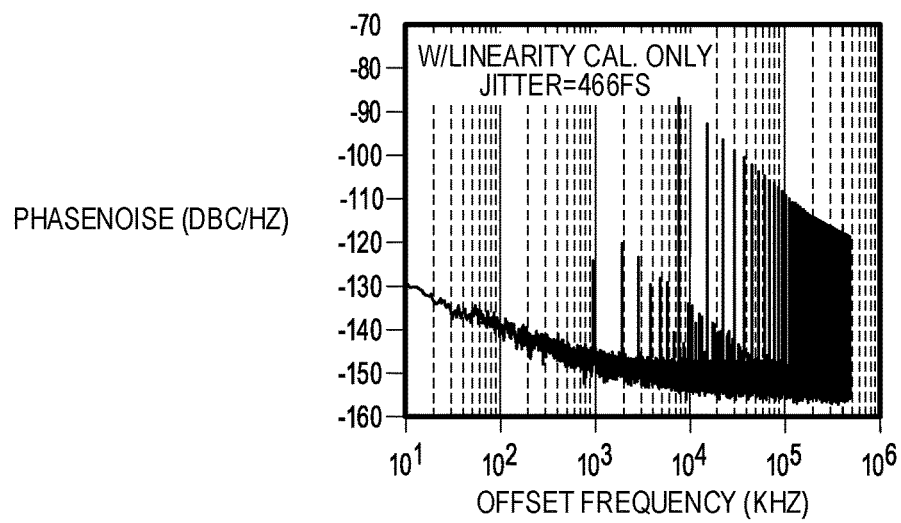
Figure 6C:
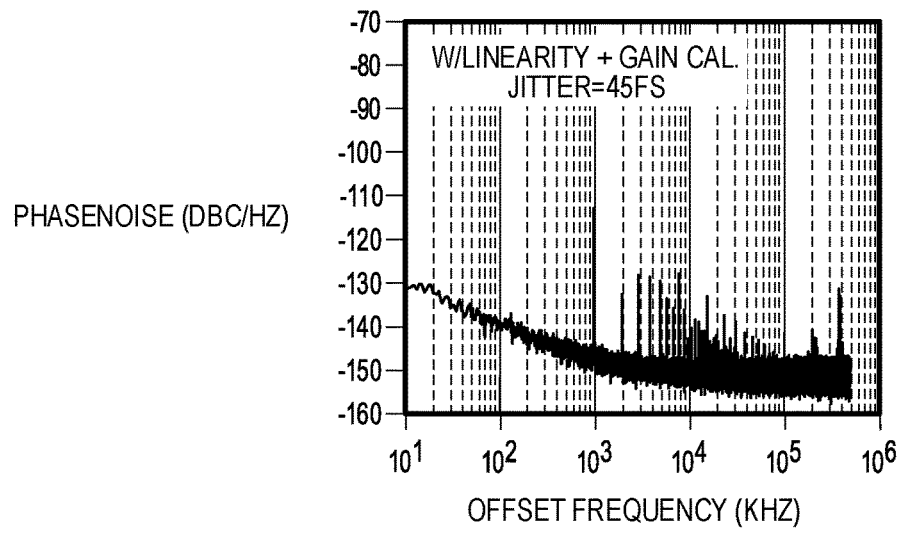

FIGS. 6A-6C show simulated phase-noise graphs 600, according to some embodiments described herein. Graphs 600 show the improvement in jitter performance using the DTC calibration circuit with the presence of a maximum delay error of 10 ps. FIG. 6A shows a simulated phase-noise plot without calibration, which results in an estimated root-mean-square (RMS) jitter of 4 picoseconds (e.g., 4,000 femtoseconds). FIG. 6B shows simulated phase-noise from a DTC calibration circuit that applies only linearly calibration, which results in an estimated RMS jitter of 466 femtoseconds, which is dominated by gain error. FIG. 6C shows simulated phase-noise from a DTC calibration circuit that applies both linearly calibration and gain calibration, which results in an estimated RMS jitter of 45 femtoseconds. The small remaining spurs are due to the PLL noise. This demonstrates that the DTC calibration circuit may be used to eliminate the use of multiple, area-intensive LC PLLs in an SoC and still achieve sub-100 fs jitter with similar or even lower power consumption. This DTC calibration circuit may provide a calibrated clock signal with an RMS jitter of 50 fs while dissipating 6 mW power, providing significant improvement over fractional-N LC PLL jitter performance and power consumption.

Figure 7:
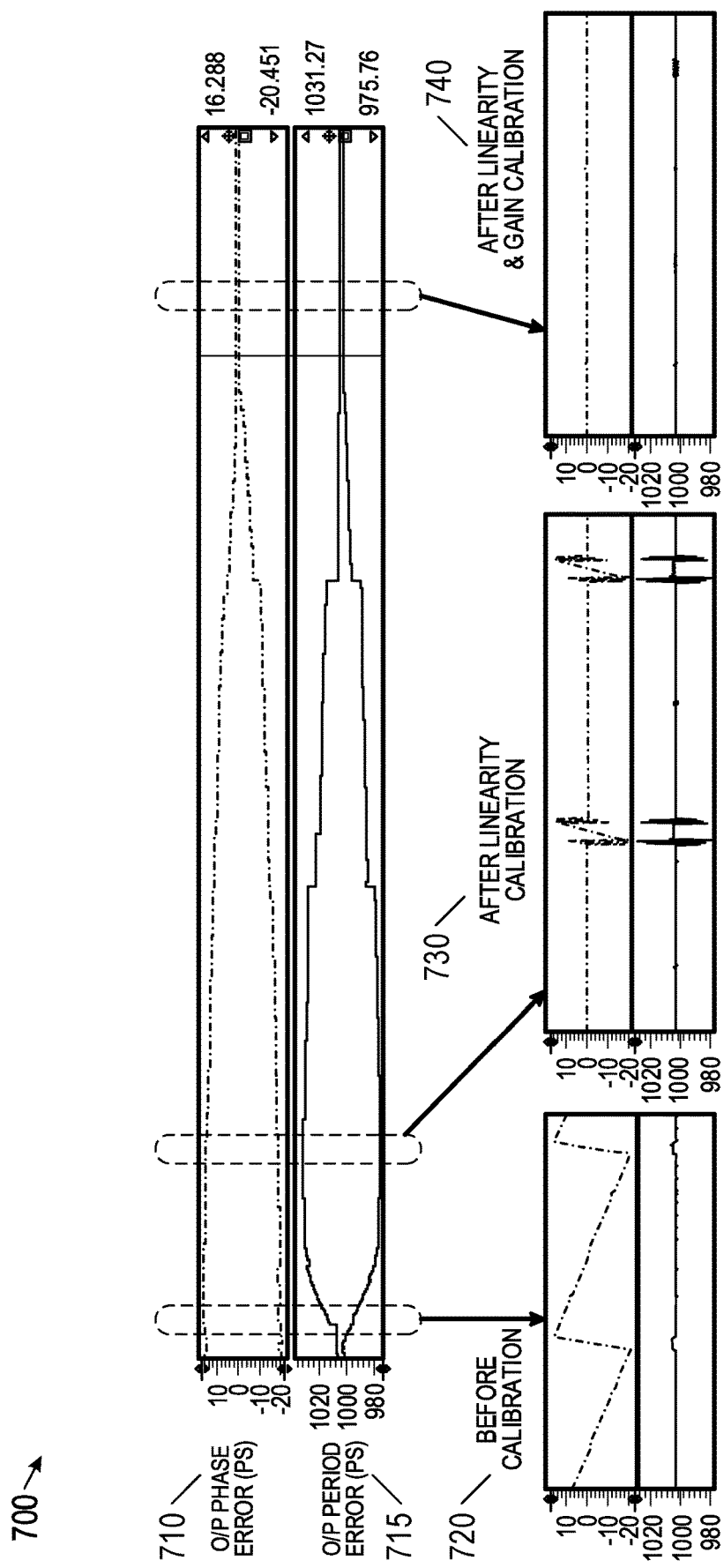
FIG. 7 shows a simulated DTC calibration transient response graph, according to some embodiments described herein.

FIG. 7 shows a simulated DTC calibration transient response graph 700, according to some embodiments described herein. Transient response graph 700 was generated using a Verilog register-transfer level (RTL) simulation of the DTC calibration circuit using 16 bins. Transient response graph 700 shows time-synchronized graphs of the output phase error 710 and the output period error 715.

FIG. 7 also shows zoomed-in portions of graph 700, including a first graph excerpt 720 showing phase and period before calibration, a second graph excerpt 730 showing phase and period after linearity calibration, and third graph excerpt 740 showing phase and period after linearity and gain calibration. As shown in pre-calibration first graph excerpt 720, initially the DTC delay is incorrectly tuned. This causes an incorrect period and results in a large ramp in the output phase error. As shown in second graph excerpt 730, the phase error reduces as the linearity correction loop corrects for average delay in each bin. The gain error is still present in second graph excerpt 730, but this gain error is eventually corrected by the LMS correlator placed in each bin, as shown in third graph excerpt 740.

Figure 8:
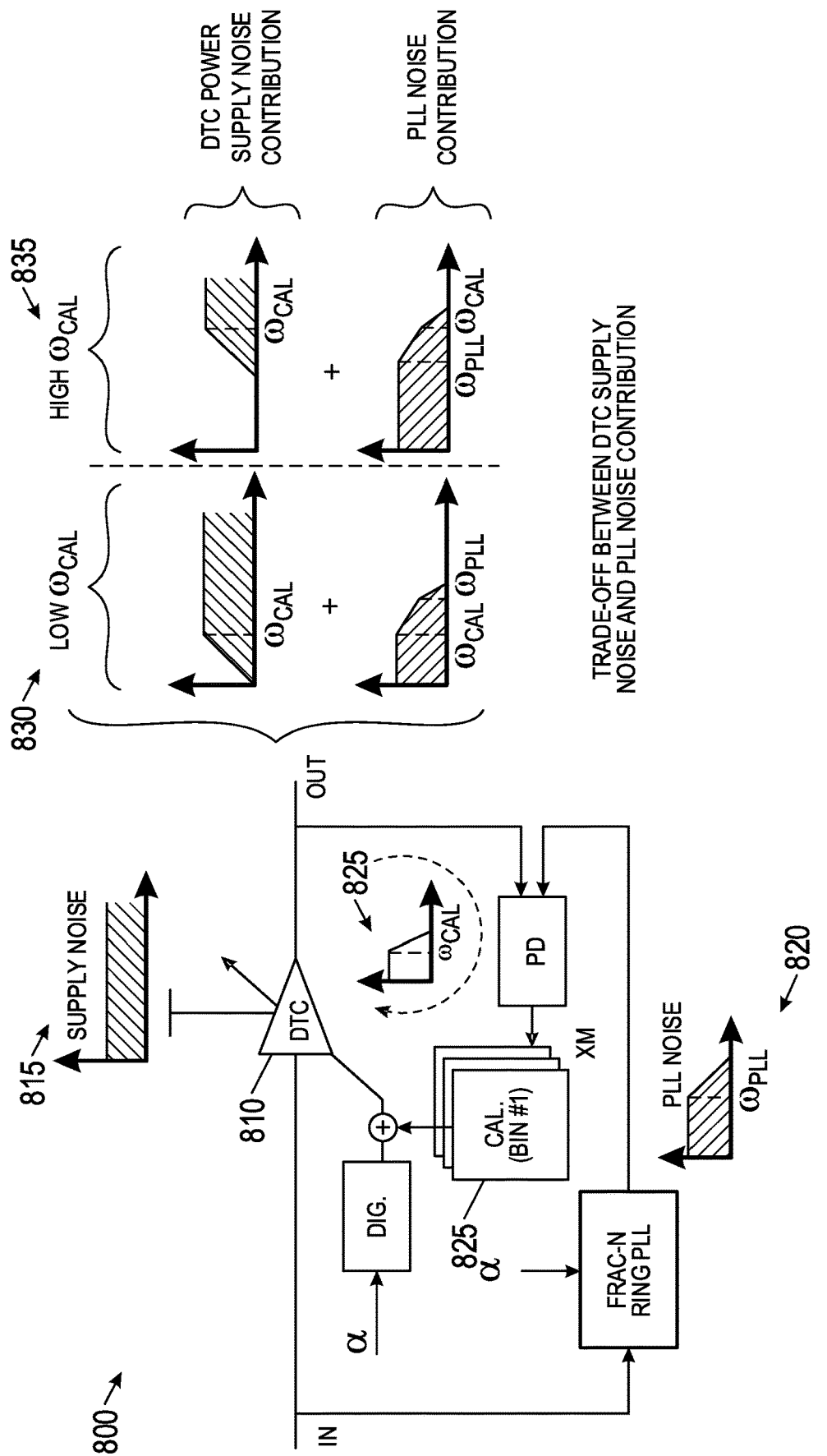
FIG. 8 shows a DTC power supply noise effect, according to some embodiments described herein.

FIG. 8 shows a DTC power supply noise effect 800, according to some embodiments described herein. DTC 810 is generally sensitive to power supply noise 815. This sensitivity is similar to any delay chain used in a given clock distribution network. However, the DTC calibration circuit described herein is able to filter out low frequency delay variation due to power supply noise 815, flicker noise within the DTC 810, temperature drift, and PLL noise 820. This filtering within the DTC calibration circuit is achieved by selection of the bandwidth of the calibration loop $\omega_{cal}$ 825. As shown in FIG. 8, the DTC calibration circuit output noise is affected by the selection of the calibration loop bandwidth $\omega_{cal}$ 825. For a lower $\omega_{cal}$ 830, the DTC output noise is a combination of an increased DTC power supply noise contribution and a reduced PLL noise contribution. In contrast, the higher $\omega_{cal}$ 835, the DTC output noise is a combination of a reduced DTC power supply noise contribution over a wider bandwidth and an increased PLL noise contribution. The bandwidth of the calibration loop $\omega_{cal}$ 825 may be selected based on the sensitivity of the DTC 810 to power supply noise 815. In an example, a higher $\omega_{cal}$ 825 may be selected for use with a higher sensitivity of the DTC 810 to power supply noise 815, while increasing ring PLL power consumption to reduce the PLL noise contribution. For high-performance DTC applications, the DTC calibration circuit may further include a low-dropout (LDO) regulator to further reduce sensitivity to the power supply noise. Temperature drift may also cause DTC delay variation, and may therefore be reduced as with supply noise. In particular, because temperature drift occurs slowly, a low bandwidth calibration loop may be sued to correct for any delay error due to temperature variation.

Figure 9:
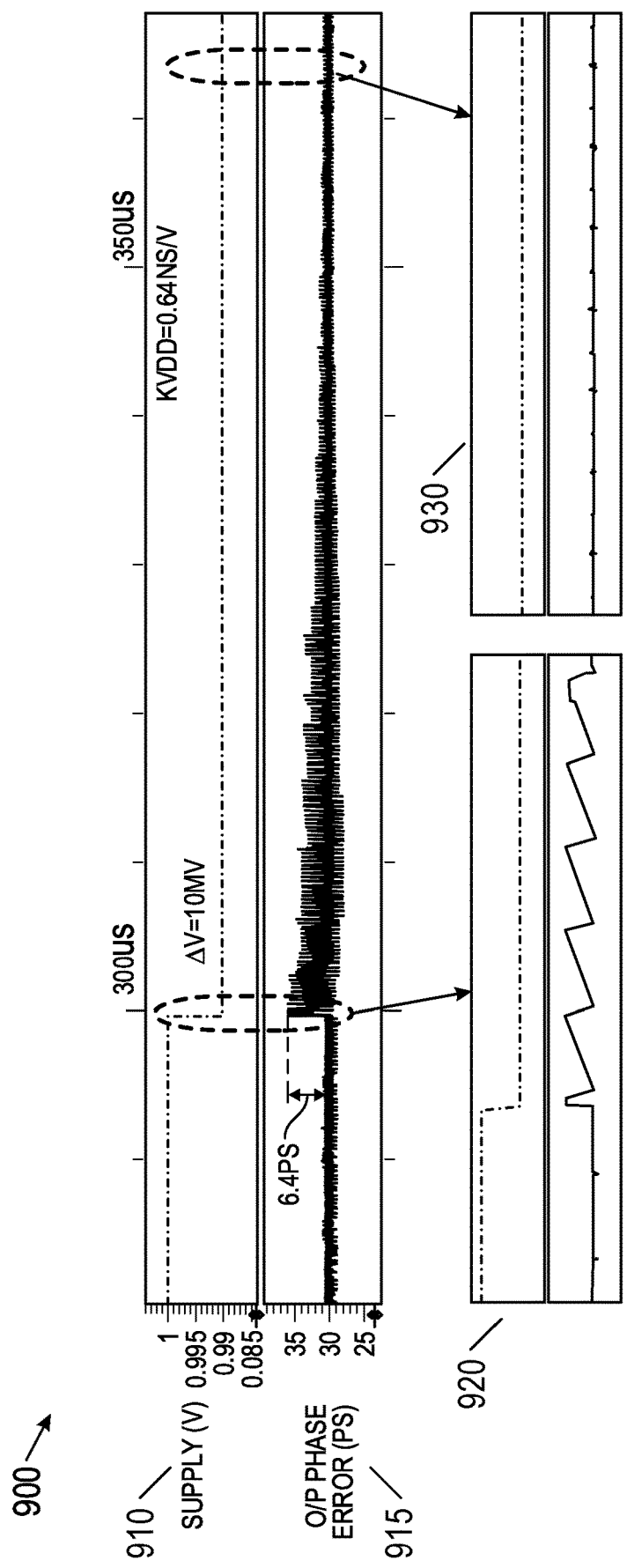
FIG. 9 shows a DTC output phase response graph, according to some embodiments described herein.

FIG. 9 shows a DTC output phase response graph 900, according to some embodiments described herein. Phase response graph 900 was generated using a Verilog register-transfer level (RTL) simulation of the DTC calibration circuit with the presence of any delay variation due to power supply noise or temperature drift. Phase response graph 900 shows time-synchronized graphs of the supply voltage 910 and the output phase error 915. FIG. 9 also shows zoomed-in portions of graph 900, including a first graph excerpt 920 showing a power supply voltage step and phase response, and a second graph excerpt 930 showing a post-step convergence. As shown in first graph excerpt 920, a voltage step results in a step change and sawtooth-like waveform in the output phase error. As shown in second graph excerpt 930, the output phase error is gradually corrected by the calibration loops within the DTC calibration circuit. The DTC calibration circuit calibration loops would also correct a step change in temperature, however temperature-based errors are further reduced due to the relatively slow drift of temperature changes.

The DTC output phase response may also be used to identify the use of the DTC calibration circuit. The usage of the DTC calibration circuit described herein may be observed by causing a stepwise change in the voltage supply 910 and observing the output phase error 915, such as by using a Signal-Source Analyzer (SSA). As shown in first graph excerpt 920, an induced voltage step will result in a step change and sawtooth-like waveform in the output phase error with a period of 1/(αfin). Because the DTC calibration range is divided into multiple bins for calibration, this output phase error will gradually be corrected in a piecewise segmented way. The bin having largest gain and linearity error will take longer to converge, generating a specific signature associated with DTC calibration circuit described herein. This behavior is in contrast with approaches that use a closed-loop configuration with multiple PLLs. Because each PLL has a low-pass characteristic from input to output, any change in the frequency control word a will require some settling time to appear as a frequency change αfin at the output. This settling time is a function of the PLL loop bandwidth, and will therefore change for different bandwidth tuning code. In contrast, the DTCs used in the DTC calibration circuit are open-loop, so any change in a immediately appears at the output. Because of this sensitivity to a, the DTC output phase response may also be used to identify the use of the DTC calibration circuit.

Figure 10:
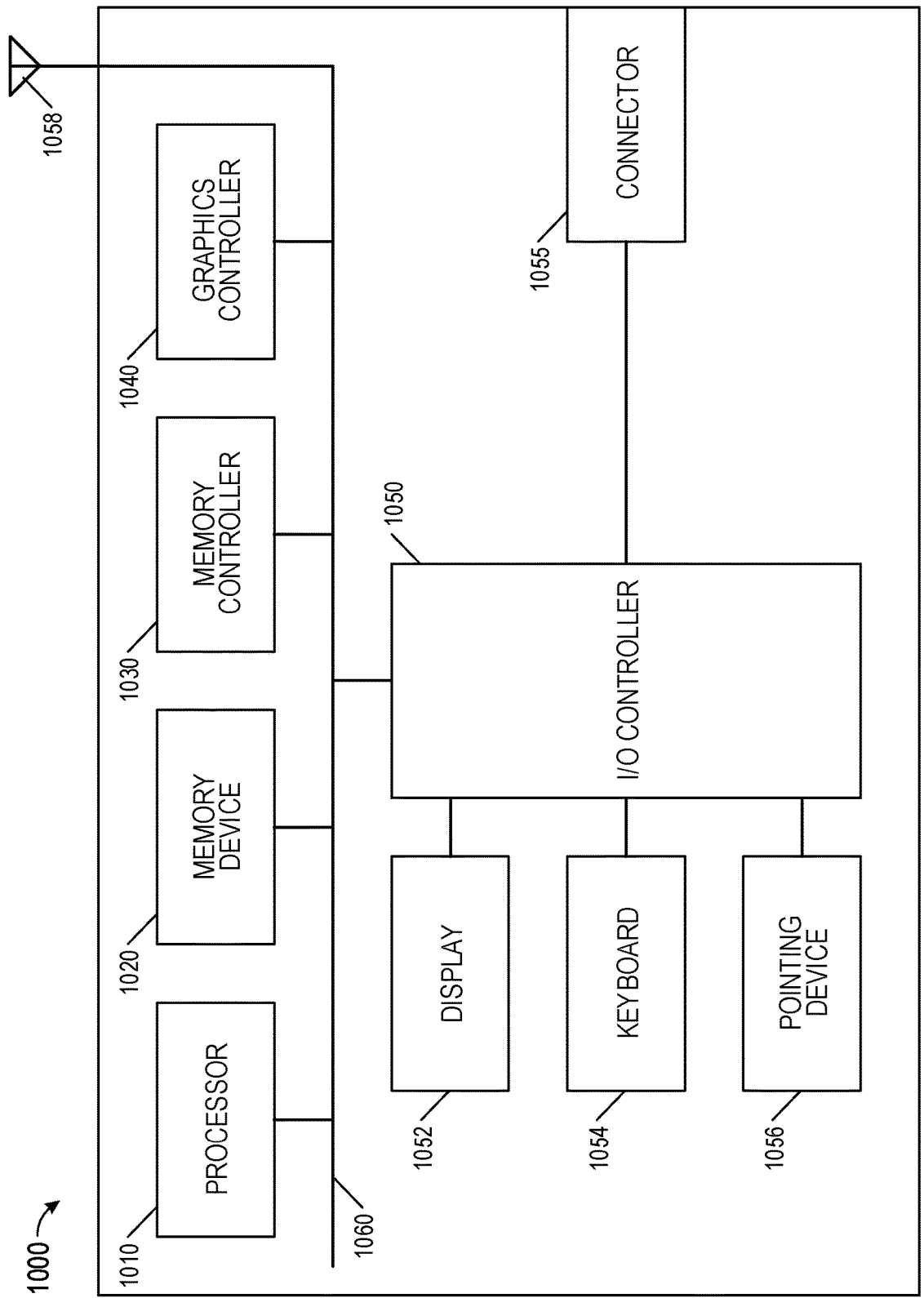
FIG. 10 shows an apparatus in the form of a system, according to some embodiments described herein.

FIG. 10 shows an apparatus in the form of a system (e.g., electronic system) 1000, according to some embodiments described herein. System 1000 may include or be included in a computer, a tablet, or other electronic system. As shown in FIG. 10, system 1000 may include components located on a circuit board (e.g., printed circuit board (PCB)) 1002, such as a processor 1010, a memory device 1020, a memory controller 1030, a graphics controller 1040, an I/O controller 1050, a display 1052, a keyboard 1054, a pointing device 1056, at least one antenna 1058, a connector 1055, and a bus 1060. Display 1052 may include a liquid crystal display (LCD), a touchscreen (e.g., capacitive or resistive touchscreen), or another type of display. Pointing device 1056 may include a mouse, a stylus, or another type of pointing device. Bus 1060 may include conductive lines (e.g., metal-based traces on a circuit board where the components of system 1000 are located).

Processor 1010 may include a general-purpose processor, an application specific integrated circuit (ASIC), or other kinds of processors. Processor 1010 may include a CPU. Memory device 1020 may include a dynamic random access memory (DRAM) device, a static random access memory (SRAM) device, a flash memory device, phase change memory, a combination of these memory devices, or other types of memory. FIG. 10 shows an example where memory device 1020 is a stand-alone memory device separated from processor 1010. In an alternative arrangement, memory device 1020 and processor 1010 may be located on the same die. In such an alternative arrangement, memory device 1020 is an embedded memory in processor 1010, such as embedded DRAM (eDRAM), embedded SRAM (eSRAM), embedded flash memory, or another type of embedded memory.

I/O controller 1050 may include a communication module for wired or wireless communication (e.g., communication through one or more antenna 1058). Such wireless communication may include communication in accordance with WiFi communication technique, Long Term Evolution Advanced (LTE-A) communication technique, or other communication techniques. I/O controller 1050 may also include a module to allow system 1000 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 1055 may be arranged (e.g., may include terminals, such as pins) to allow system 1000 to be coupled to an external device (or system). This may allow system 1000 to communicate (e.g., exchange information) with such a device (or system) through connector 1055. Connector 1055 and at least a portion of bus 1060 may include conductive lines that conform with at least one of USB, DP, HDMI, Thunderbolt, PCIe, Ethernet, and other specifications.

As shown in FIG. 10, each of processor 1010, memory device 1020, memory controller 1030, graphics controller 1040, and I/O controller 1050 may include the DTC calibration circuit described above with reference to FIG. 1 through FIG. 9. FIG. 10 shows each of processor 1010, memory device 1020, memory controller 1030, graphics controller 1040, and I/O controller 1050 including DTC calibration circuit, as an example. However, fewer than all of processor 1010, memory device 1020, memory controller 1030, graphics controller 1040, and I/O controller 1050 may include the DTC calibration circuit.

FIG. 10 shows the components of system 1000 arranged separately from each other as an example. For example, each of processor 1010, memory device 1020, memory controller 1030, graphics controller 1040, and I/O controller 1050 may be located on a separate IC (e.g., semiconductor die or an IC chip). In some arrangements, two or more components (e.g., processor 1010, memory device 1020, graphics controller 1040, and I/O controller 1050) of system 1000 may be located on the same die (e.g., same IC chip) that may be part of a system on chip, a system in a package, or other electronic devices or systems, The illustrations of the DTC calibration circuit described above are intended to provide a general understanding of the structure of different embodiments, and are not intended to provide a complete description of all the elements and features of an apparatus that might make use of the structures described herein. In some arrangements, system 1000 does not have to include a display. Thus, display 1052 may be omitted from system 1000. In some arrangements, system 1000 does not have to include any antenna. Thus, antenna 1058 may be omitted from system 1000. In some arrangements, system 1000 does not have to include a connector. Thus, connector 1055 may be omitted from system 1000.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

ADDITIONAL NOTES AND EXAMPLES

Example 1 is an apparatus comprising: a digital-to-time converter (DTC) to generate a DTC clock signal based on a received input clock frequency and a received initial digital input code; a phase-lock loop (PLL) to generate a PLL clock signal based on a received PLL input; a binary phase-detector (PD) to generate a PD output based on a comparison between the DTC clock signal and the PLL clock signal; a plurality of calibration bins, each of the plurality of calibration bins associated with one of a plurality of DTC calibration range portions, each of the plurality of calibration bins to generate a signed accumulated PD portion based on the PD output, the signed accumulated PD portion associated with one of the plurality of DTC calibration range portions; and an adder to generate a calibrated DTC input code based on a combination of the signed accumulated PD portion and a subsequent digital input code; wherein the DTC is further to generate a calibrated clock signal based on the calibrated DTC input code.

In Example 2, the subject matter of Example 1 includes, wherein the DTC clock signal has an associated DTC output frequency based on the received input clock frequency and an alpha fractional DTC code.

In Example 3, the subject matter of Example 2 includes, a second order delta-sigma modulator (DSM) to generate a DSM output based on the alpha fractional DTC code, a PLL integer, and a pseudo-random bit sequence (PRBS); and a multi-modulo divider (MMD) to generate the received PLL input based on the DSM output.

In Example 4, the subject matter of Examples 1-3 includes, wherein each of the plurality of calibration bins maintains an associated zero-mean average phase error by continuously accumulating the signed accumulated PD portion.

In Example 5, the subject matter of Examples 1-4 includes, wherein each of the plurality of calibration bins includes a least means square (LMS) correlator to generate a gain error correction multiplication factor based on a correlation between the PD output and the received initial digital input code.

In Example 6, the subject matter of Example 5 includes, wherein each of the plurality of calibration bins includes a multiplier to generate a gain corrected code based on the received initial digital input code and the gain error correction multiplication factor.

In Example 7, the subject matter of Examples 1-6 includes, a multiplexer to select one of the plurality of calibration bins and provide the calibrated DTC input code to the DTC.

In Example 8, the subject matter of Examples 1-7 includes, wherein: the PLL clock signal has an associated PLL frequency substantially equal to a desired DTC output frequency; and the PLL clock signal has an associated zero mean value PLL jitter.

In Example 9, the subject matter of Examples 1-8 includes, wherein the PLL includes a fractional-N ring oscillator PLL.

In Example 10, the subject matter of Examples 1-9 includes, a memory to store the calibrated DTC input code, wherein the calibrated DTC input code is received from the memory and provided to the DTC to reduce a convergence time.

Example 11 is a method comprising: generating a digital-to-time converter (DTC) clock signal at a DTC circuit based on a received input clock frequency and a received initial digital input code; generating a phase-lock loop (PLL) clock signal at a PLL circuit based on a received PLL input; generating a phase-detector (PD) output at a binary PD based on a comparison between the DTC clock signal and the PLL clock signal; generating a signed accumulated PD portion based on the PD output at each of a plurality of calibration bins, each of the plurality of calibration bins associated with one of a plurality of DTC calibration range portions, the signed accumulated PD portion associated with one of the plurality of DTC calibration range portions; generating a calibrated DTC input code at an adder based on a combination of the signed accumulated PD portion and a subsequent digital input code; and generating a calibrated clock signal at the DTC based on the calibrated DTC input code.

In Example 12, the subject matter of Example 11 includes, wherein the DTC clock signal has an associated DTC output frequency based on the received input clock frequency and an alpha fractional DTC code.

In Example 13, the subject matter of Example 12 includes, generating a (DSM) output at a second order DSM circuit based on the alpha fractional DTC code, a PLL integer, and a pseudo-random bit sequence (PRBS); and generating the received PLL input at a multi-modulo divider (MMD) based on the DSM output.

In Example 14, the subject matter of Examples 11-13 includes, maintaining an associated zero-mean average phase error at each of the plurality of calibration bins by continuously accumulating the signed accumulated PD portion.

In Example 15, the subject matter of Examples 11-14 includes, generating a gain error correction multiplication factor at a least means square (LMS) correlator within each of the plurality of calibration bins, the gain error correction multiplication factor generated based on a correlation between the PD output and the received initial digital input code.

In Example 16, the subject matter of Example 15 includes, generating a gain corrected code at a multiplier within each of the plurality of calibration bins, the multiplier generated based on the received initial digital input code and the gain error correction multiplication factor.

In Example 17, the subject matter of Examples 11-16 includes, selecting one of the plurality of calibration bins at a multiplexer; and providing the calibrated DTC input code from the multiplexer to the DTC.

In Example 18, the subject matter of Examples 11-17 includes, wherein: the PLL clock signal has an associated PLL frequency substantially equal to a desired DTC output frequency; and the PLL clock signal has an associated zero mean value PLL jitter.

In Example 19, the subject matter of Examples 11-18 includes, wherein the PLL includes a fractional-N ring oscillator PLL.

In Example 20, the subject matter of Examples 11-19 includes, storing the calibrated DTC input code within a memory; retrieving the calibrated DTC input code from the memory; and providing the calibrated DTC input code to the DTC to reduce a convergence time.

Example 21 is an apparatus comprising: a processor including a processing circuitry and a digital-to-time converter (DTC) clock signal generator coupled to the processing circuitry, the DTC clock signal generator including: a digital-to-time converter (DTC) to generate a DTC clock signal based on a received input clock frequency and a received initial digital input code; a phase-lock loop (PLL) to generate a PLL clock signal based on a received PLL input; a binary phase-detector (PD) to generate a PD output based on a comparison between the DTC clock signal and the PLL clock signal; a plurality of calibration bins, each of the plurality of calibration bins associated with one of a plurality of DTC calibration range portions, each of the plurality of calibration bins to generate a signed accumulated PD portion based on the PD output, the signed accumulated PD portion associated with one of the plurality of DTC calibration range portions; and an adder to generate a calibrated DTC input code based on a combination of the signed accumulated PD portion and a subsequent digital input code; wherein the DTC is further to generate a calibrated clock signal based on the calibrated DTC input code.

In Example 22, the subject matter of Example 21 includes, wherein the DTC clock signal has an associated DTC output frequency based on the received input clock frequency and an alpha fractional DTC code.

In Example 23, the subject matter of Example 22 includes, a second order delta-sigma modulator (DSM) to generate a DSM output based on the alpha fractional DTC code, a PLL integer, and a pseudo-random bit sequence (PRBS); and a multi-modulo divider (MMD) to generate the received PLL input based on the DSM output.

In Example 24, the subject matter of Examples 21-23 includes, wherein each of the plurality of calibration bins maintains an associated zero-mean average phase error by continuously accumulating the signed accumulated PD portion.

In Example 25, the subject matter of Examples 21-24 includes, wherein each of the plurality of calibration bins includes a least means square (LMS) correlator to generate a gain error correction multiplication factor based on a correlation between the PD output and the received initial digital input code.

In Example 26, the subject matter of Example 25 includes, wherein each of the plurality of calibration bins includes a multiplier to generate a gain corrected code based on the received initial digital input code and the gain error correction multiplication factor.

In Example 27, the subject matter of Examples 21-26 includes, a multiplexer to select one of the plurality of calibration bins and provide the calibrated DTC input code to the DTC.

In Example 28, the subject matter of Examples 21-27 includes, wherein: the PLL clock signal has an associated PLL frequency substantially equal to a desired DTC output frequency; and the PLL clock signal has an associated zero mean value PLL jitter.

In Example 29, the subject matter of Examples 21-28 includes, wherein the PLL includes a fractional-N ring oscillator PLL.

In Example 30, the subject matter of Examples 21-29 includes, a memory to store the calibrated DTC input code, wherein the calibrated DTC input code is received from the memory and provided to the DTC to reduce a convergence time.

Example 31 is at least one machine-readable medium including instructions that, when executed by processing circuitry, cause the processing circuitry to perform operations to implement of any of Examples 1-30.

Example 32 is an apparatus comprising means to implement of any of Examples 1-30.

Example 33 is a system to implement of any of Examples 1-30.

Example 34 is a method to implement of any of Examples 1-30.

The subject matter of Example 1 through Example 34 may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a digital-to-time converter (DTC) to generate a DTC clock signal based on a received input clock frequency and a received initial digital input code;
a phase-lock loop (PLL) to generate a PLL clock signal based on a received PLL input;
a binary phase-detector (PD) to generate a PD output based on a comparison between the DTC clock signal and the PLL clock signal;
a plurality of calibration bins, each of the plurality of calibration bins associated with one of a plurality of DTC calibration range portions, each of the plurality of calibration bins to generate a signed accumulated PD portion based on the PD output, the signed accumulated PD portion associated with one of the plurality of DTC calibration range portions; and
an adder to generate a calibrated DTC input code based on a combination of the signed accumulated PD portion and a subsequent digital input code;
wherein the DTC is further to generate a calibrated clock signal based on the calibrated DTC input code.

2. The apparatus of claim 1, wherein the DTC clock signal has an associated DTC output frequency based on the received input clock frequency and an alpha fractional DTC code.

3. The apparatus of claim 2, further including:
a second order delta-sigma modulator (DSM) to generate a DSM output based on the alpha fractional DTC code, a PLL integer, and a pseudo-random bit sequence (PRBS); and
a multi-modulo divider (MMD) to generate the received PLL input based on the DSM output.

4. The apparatus of claim 1, wherein each of the plurality of calibration bins maintains an associated zero-mean average phase error by continuously accumulating the signed accumulated PD portion.

5. The apparatus of claim 1, wherein each of the plurality of calibration bins includes a least means square (LMS) correlator to generate a gain error correction multiplication factor based on a correlation between the PD output and the received initial digital input code.

6. The apparatus of claim 5, wherein each of the plurality of calibration bins includes a multiplier to generate a gain corrected code based on the received initial digital input code and the gain error correction multiplication factor.

7. The apparatus of claim 1, further including a multiplexer to select one of the plurality of calibration bins and provide the calibrated DTC input code to the DTC.

8. The apparatus of claim 1, wherein:
the PLL clock signal has an associated PLL frequency substantially equal to a desired DTC output frequency; and
the PLL clock signal has an associated zero mean value PLL jitter.

9. The apparatus of claim 1, wherein the PLL includes a fractional-N ring oscillator PLL.

10. The apparatus of claim 1, further including a memory to store the calibrated DTC input code, wherein the calibrated DTC input code is received from the memory and provided to the DTC to reduce a convergence time.

11. A method comprising:
generating a digital-to-time converter (DTC) clock signal at a DTC circuit based on a received input clock frequency and a received initial digital input code;
generating a phase-lock loop (PLL) clock signal at a PLL circuit based on a received PLL input;
generating a phase-detector (PD) output at a binary PD based on a comparison between the DTC clock signal and the PLL clock signal;
generating a signed accumulated PD portion based on the PD output at each of a plurality of calibration bins, each of the plurality of calibration bins associated with one of a plurality of DTC calibration range portions, the signed accumulated PD portion associated with one of the plurality of DTC calibration range portions;
generating a calibrated DTC input code at an adder based on a combination of the signed accumulated PD portion and a subsequent digital input code; and
generating a calibrated clock signal at the DTC based on the calibrated DTC input code.

12. The method of claim 11, wherein the DTC clock signal has an associated DTC output frequency based on the received input clock frequency and an alpha fractional DTC code.

13. The method of claim 12, further including:
generating a (DSM) output at a second order DSM circuit based on the alpha fractional DTC code, a PLL integer, and a pseudo-random bit sequence (PRBS); and
generating the received PLL input at a multi-modulo divider (MMD) based on the DSM output.

14. The method of claim 11, further including maintaining an associated zero-mean average phase error at each of the plurality of calibration bins by continuously accumulating the signed accumulated PD portion.

15. The method of claim 11, further including generating a gain error correction multiplication factor at a least means square (LMS) correlator within each of the plurality of calibration bins, the gain error correction multiplication factor generated based on a correlation between the PD output and the received initial digital input code.

16. The method of claim 15, generating a gain corrected code at a multiplier within each of the plurality of calibration bins, the multiplier generated based on the received initial digital input code and the gain error correction multiplication factor.

17. The method of claim 11, further including:
selecting one of the plurality of calibration bins at a multiplexer; and
providing the calibrated DTC input code from the multiplexer to the DTC.

18. The method of claim 11, further including:
storing the calibrated DTC input code within a memory;
retrieving the calibrated DTC input code from the memory; and
providing the calibrated DTC input code to the DTC to reduce a convergence time.

19. An apparatus comprising:
a processor including a processing circuitry and a digital-to-time converter (DTC) clock signal generator coupled to the processing circuitry, the DTC clock signal generator including:
a digital-to-time converter (DTC) to generate a DTC clock signal based on a received input clock frequency and a received initial digital input code;
a phase-lock loop (PLL) to generate a PLL clock signal based on a received PLL input;
a binary phase-detector (PD) to generate a PD output based on a comparison between the DTC clock signal and the PLL clock signal;
a plurality of calibration bins, each of the plurality of calibration bins associated with one of a plurality of DTC calibration range portions, each of the plurality of calibration bins to generate a signed accumulated PD portion based on the PD output, the signed accumulated PD portion associated with one of the plurality of DTC calibration range portions; and an adder to generate a calibrated DTC input code based on a combination of the signed accumulated PD portion and a subsequent digital input code;

wherein the DTC is further to generate a calibrated clock signal based on the calibrated DTC input code.

20. The apparatus of claim 19, wherein the DTC clock signal has an associated DTC output frequency based on the received input clock frequency and an alpha fractional DTC code.

21. The apparatus of claim 20, further including:

a second order delta-sigma modulator (DSM) to generate a DSM output based on the alpha fractional DTC code, a PLL integer, and a pseudo-random bit sequence (PRBS); and a multi-modulo divider (MMD) to generate the received PLL input based on the DSM output.

22. The apparatus of claim 19, wherein each of the plurality of calibration bins maintains an associated zero-mean average phase error by continuously accumulating the signed accumulated PD portion.

23. The apparatus of claim 19, wherein each of the plurality of calibration bins includes a least means square (LMS) correlator to generate a gain error correction multiplication factor based on a correlation between the PD output and the received initial digital input code.

24. The apparatus of claim 23, wherein each of the plurality of calibration bins includes a multiplier to generate a gain corrected code based on the received initial digital input code and the gain error correction multiplication factor.

25. The apparatus of claim 19, further including a multiplexer to select one of the plurality of calibration bins and provide the calibrated DTC input code to the DTC.

* * * * *